(12) United States Patent
Rehnelt et al.

(10) Patent No.: US 6,469,248 B1
(45) Date of Patent: Oct. 22, 2002

(54) HYBRID CIRCUIT WITH A HEAT DISSIPATION SYSTEM

(75) Inventors: Karl Rehnelt, Munich (DE); Frank Templin, Berlin (DE); Ingo Skuras, Munich (DE)

(73) Assignee: Tyco Electronics Logistics AG (CH)

( * ) Notice: Subject to any disclaimer, the term of this patent is extended or adjusted under 35 U.S.C. 154(b) by 0 days.

(21) Appl. No.: 09/581,620

(22) PCT Filed: Nov. 12, 1998

(86) PCT No.: PCT/DE98/03333
§ 371 (c)(1),
(2), (4) Date: Aug. 23, 2000

(87) PCT Pub. No.: WO99/34657
PCT Pub. Date: Jul. 8, 1999

(30) Foreign Application Priority Data

Dec. 23, 1997 (DE) .......................................... 197 57 612

(51) Int. Cl.[7] ................................................. H05K 7/20
(52) U.S. Cl. ........................ 174/52.1; 361/720; 257/693
(58) Field of Search ................................ 174/52.1, 250, 174/252, 255, 258; 361/720, 722, 723; 257/669, 670, 671, 674, 747; 439/485, 486, 487; 206/706

(56) References Cited

U.S. PATENT DOCUMENTS 6,060,780 A * 5/2000 Ohta et al. .................. 257/731

FOREIGN PATENT DOCUMENTS

| EP | 631312 | * 12/1994 | |
| JP | 5308114 | * 11/1993 | .................. 257/693 |
| JP | 7130909 | * 5/1995 | |

* cited by examiner

Primary Examiner—Dean A. Reichard
Assistant Examiner—Carmelo Oliva
(74) Attorney, Agent, or Firm—Baker & Daniels

(57) ABSTRACT

A hybrid circuit with a heat dissipation system includes a terminal arrangement wherein at least one of the connecting pins (5) to solder the hybrid circuit (1) on a printed board has a heat transition resistance to the hybrid circuit (1), which is greater in relation to the other connecting pins (2) in such a way that the connecting pin (5) does not reach the melting temperature of the solder used at a given power level.

7 Claims, 1 Drawing Sheet

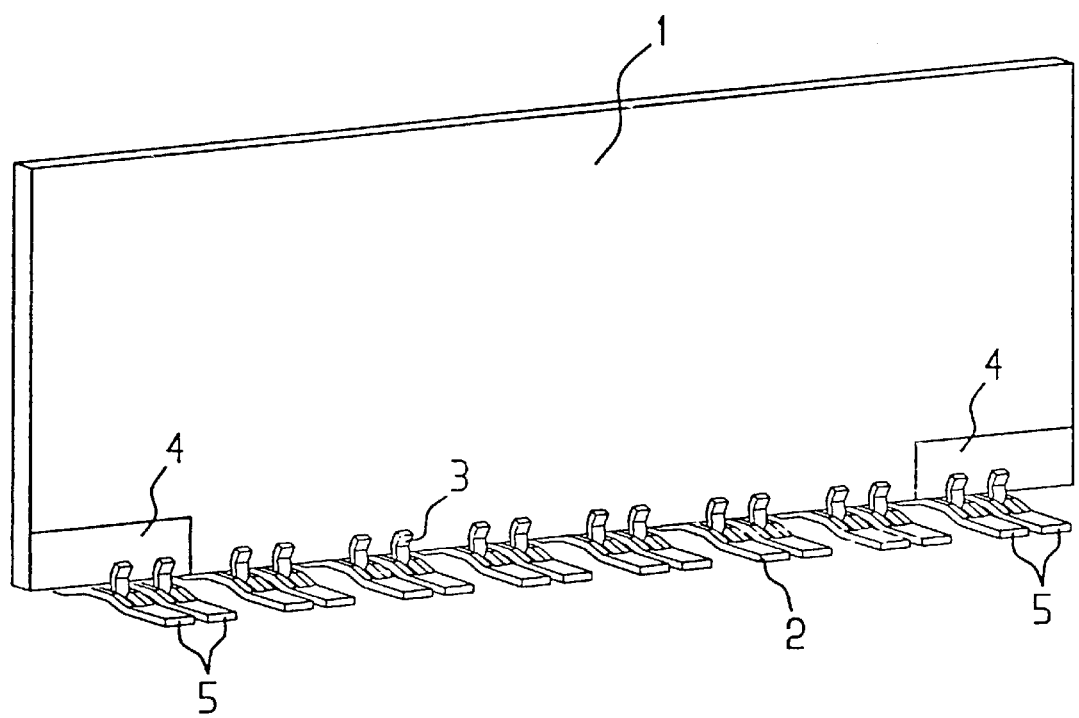

HYBRID CIRCUIT WITH A HEAT DISSIPATION SYSTEM

This application is the U.S. national phase of PCT application PCT/DE98/03333 filed Nov. 12, 1998, with a claim to the priority of German application DE 19757612.5 filed Dec. 23, 1997.

BACKGROUND OF THE INVENTION

The invention relates to a hybrid circuit and in particular, a hybrid circuit, surface mountable on a circuit board, and having a heat dissipation system.

Hybrid or sandwich circuits are electronic subassemblies in which planar conductive track structures and passive components, in particular resistors, are applied to a ceramic substrate by means of specific film technologies, with thee planar structures on the common ceramic substrate being adapted to be connected or hybridized with other components, for example ICs or relays. These further components usually are adapted to be surface mounted, i.e. using the known SMD (Surface Mounted Devices) technology, they are placed on connecting pads on the hybrid circuit and soldered there, mostly by reflow soldering.

Hybrid circuits on ceramic carrier material permit high power levels on the smallest possible constructional space. This is often accompanied by strong heating of the assembly. This strong heating must be removed or dissipated from the component. Usually, part of the dissipation takes place via the component surface and another part via the terminal pins. If the heat cannot be discharged sufficiently via the terminal pins, or if the heat exceeds the melting temperature of the solder used for soldering the pins to the circuit board, the hybrid circuit unsolders itself in the circuit board. If the individual solder points melt and become pasty, the electrical connection indeed is still maintained via the individual terminal pins, but the mechanical stability of the hybrid circuit in relation to the circuit board is no longer present.

This problem is of particular significance with SMD applications in which the hybrid circuit in its entirety is to be SMD-suitable. For obtaining high integration density, hybrid circuits nowadays are soldered to circuit boards mostly in the form of a single-in-line subassemblies. To make use of the space present in the third dimension, they are thus mounted perpendicularly to the circuit board or substrate with only one row of terminals. The above-outlined stability problem thus does not make itself felt particularly in the case of single-in-line hybrid assemblies mounted to a circuit board by through-mounting, but is significant in the case of such assemblies mounted by SMD technology. For limiting the temperature increase of the terminal pins, additional heat sinks are mounted to the hybrid circuit; or, the power level in the component is subjected to stronger limitations.

SUMMARY OF THE INVENTION

The present invention provides a hybrid circuit having an SMD-suitable terminal pin arrangement for attachment of the hybrid circuit to a circuit board. The terminal arrangement includes a plurality of terminal pins for soldering the hybrid circuit to a circuit board, in which at least part of the heat developed on the basis of the power consumption of the hybrid circuit can be dissipated via the terminal pins to the circuit board.

It is an object of the invention to provide a hybrid circuit, surface mountable on a circuit board, which has an improved system for heat dissipation and temperature limitation without the use of additional heat sinks on the hybrid circuit.

With a hybrid circuit of the present invention, this object is met in that at least one terminal pin is provided with a thermal transition resistance to the hybrid circuit which is higher than that of the other terminal pins in such a way that this terminal pin does not reach the melting temperature of the solder used at a given power consumption.

The invention will be elucidated in more detail hereinafter by way of the description of a preferred embodiment with reference to the sole drawing FIGURE.

DESCRIPTION OF THE FIGURES

The FIGURE is a side view of a hybrid circuit along with a terminal arrangement according to the present invention.

DESCRIPTION OF THE PREFERRED EMBODIMENTS

For the purposes of promoting an understanding of the principles of the invention, reference will now be made to the embodiments illustrated in the drawings and specific language will be used to describe the same. It will nevertheless be understood that no limitation of the scope of the invention is thereby intended. The inventions includes any alterations and further modifications in the illustrated devices and described methods and further applications of the principles of the invention which would normally occur to one skilled in the art to which the invention relates.

According to the invention, purposeful control of the heat dissipation via the terminal pins is achieved in that some of the terminal pins are thermally insulated or provided with a higher thermal transition resistance, so that these terminal pins are not unsoldered automatically in the case of a possible increased heat development.

The thermal insulation of the terminal pins may be effected advantageously by one or more intermediate layers printed under the terminations of the pins in thin film or thick film technology and with the film consisting of dielectric or glass. On top thereof, there is located the usual conductor track or resistance layer, via which the connection of the hybrid circuit to the respective terminal pin is realized. Despite thermal insulation, the electrical connection to these terminal pins can be maintained, or if desired, the pins may be dummy pins. By selection of individual terminal pins or pin groups, controlled dissipation of the heat via the terminal pins is easily possible so that the heat may be purposefully introduced into specific portions of the circuit board.

The terminal arrangement shown in the drawing, which often is also referred to as a terminal comb, consists of a number of terminal pins 2 which are made from a stamped sheet metal part, but need not be arranged in pairs as shown. The hybrid circuit 1, as shown, may be clamped, for example, between bent-up tines 3 so that it is arranged in total perpendicularly to the common mounting plane of the terminal pins 2 and thus also perpendicularly to the substrate or circuit board plane. On the insides of the tines 3, there may be provided a solder inlay so that, when soldering the entire arrangement to a circuit board, the solder connections between the terminal comb and hybrid circuit are formed as well. As shown, the respective outer terminal pins 5 of the terminal row advantageously may have an insulting layer 4 arranged therebelow, so that the heat dissipation takes place via the central terminal pins 2 and unsoldering of the hybrid circuit is prevented since the outer pins 5 do not reach the melting temperature of the solder material used.

While the invention has been illustrated and described in detail in the drawings and foregoing description, the same is to be considered as illustrative and not restrictive in character. It should be understood that only the preferred embodiments have been shown and described and that all changes and modifications that come within the spirit of the invention are desired to be protected.

What is claimed is:

1. A hybrid circuit suitable for attachment to a circuit board using surface mounted devices (SMD) technology, said hybrid circuit comprising a terminal arrangement having a plurality of terminal pins having a pin termination for soldering said hybrid circuit to the circuit board, in which at least part of the heat developed on the basis of the power consumption of said hybrid circuit can be dissipated via said terminal pins to the a circuit board, and wherein an at least one terminal pin is provided with a thermal transition resistance to said hybrid circuit that is higher than that of the other terminal pins, said at least one terminal pin is provided by an at least one intermediate layer of glass distinct from said hybrid circuit under said pin termination of said at least one terminal pin so that said at least one terminal pin does not reach the melting temperature of the solder used at a given power consumption.

2. The hybrid circuit of claim 1, wherein said at least one terminal pin is positioned such that the heat can be discharged purposefully into specific portions of the circuit board.

3. A hybrid circuit suitable for attachment to a circuit board using surface mounted devices (SMD) technology, said hybrid circuit comprising a terminal arrangement having a plurality of terminal pins for soldering the hybrid circuit to the circuit board, in which at least part of the heat developed on the basis of the power consumption of said hybrid circuit can be dissipated via said terminal pins to the circuit board, and wherein a portion of said terminal pins is provided with a thermal transition resistance to said hybrid circuit that is higher than that of the other terminal pins so that said portion of terminal pins does not reach the melting temperature of the solder used at a given power consumption, and wherein at least one of said portion of terminal pins is a current carrying pin.

4. The hybrid circuit of claim 3, wherein each of said plurality of terminal pins includes a pin termination on said hybrid circuit and said thermal transition resistance of said portion of said terminal pins is provided by at least one intermediate layer printed under said pin termination of said portion of said terminal pins.

5. The hybrid circuit of claim 4, wherein said intermediate layer is a dielectric.

6. The hybrid circuit of claim 4, wherein said intermediate layer is glass.

7. The hybrid circuit of claim 3, wherein said portion of said terminal pins is positioned such that the heat can be discharged into specific portions of the circuit board.

\* \* \* \* \*